(12) United States Patent
Takahashi

(10) Patent No.: US 9,973,181 B2
(45) Date of Patent: May 15, 2018

(54) SYNCHRONIZED SEMICONDUCTOR DEVICE WITH PHASE ADJUSTMENT CIRCUIT

(71) Applicant: Micron Technology, Inc., Boise, ID (US)

(72) Inventor: Hiroki Takahashi, Tokyo (JP)

(73) Assignee: Micron Technology, Inc., Boise, ID (US)

(*) Notice: Subject to any disclaimer, the term of this patent is extended or adjusted under 35 U.S.C. 154(b) by 0 days. days.

(21) Appl. No.: 15/677,970

(22) Filed: Aug. 15, 2017

(65) Prior Publication Data
US 2017/0346471 A1  Nov. 30, 2017

Related U.S. Application Data

(63) Continuation of application No. 14/645,257, filed on Mar. 11, 2015, now Pat. No. 9,768,760.

(51) Int. Cl.
| | |
|---|---|
| *H03L 7/06* | (2006.01) |
| *H03K 5/1534* | (2006.01) |
| *G11C 7/22* | (2006.01) |
| *H03L 7/087* | (2006.01) |
| *H03L 7/081* | (2006.01) |
| *H03K 5/06* | (2006.01) |

(52) U.S. Cl.
CPC ........... *H03K 5/1534* (2013.01); *G11C 7/222* (2013.01); *H03K 5/06* (2013.01); *H03L 7/087* (2013.01); *H03L 7/0814* (2013.01); *H03L 7/0816* (2013.01); *H03L 7/0818* (2013.01)

(58) Field of Classification Search
CPC ..... H03L 7/00; H03L 7/06; H03L 7/08; H03L 7/081; H03L 7/0812; H03L 7/0814; H03L 7/0816; H03L 7/0818; H03L 7/085; H03L 7/091; H03L 7/093; H03L 7/097; H03L 7/10; H03L 7/101
USPC .................................................. 327/156–158
See application file for complete search history.

(56) References Cited

U.S. PATENT DOCUMENTS

| | | | |
|---|---|---|---|
| 6,529,046 B1 | 3/2003 | Shih | |
| 7,386,407 B2* | 6/2008 | Tanikawa | ........... G01R 31/3016 702/189 |
| 7,872,924 B2 | 1/2011 | Ma | |
| 8,076,979 B2* | 12/2011 | Kathuria | ................. H03L 7/095 327/156 |

(Continued)

*Primary Examiner* — Lincoln Donovan
*Assistant Examiner* — Diana J Cheng
(74) *Attorney, Agent, or Firm* — Dorsey & Whitney LLP

(57) ABSTRACT

According to one embodiment, a synchronous semiconductor device is disclosed According to this embodiment, the synchronous semiconductor device includes a pulse width detection circuit to provide detection information responsive to a plurality of delay amounts being different from one another and at least one of a high pulse width and a low pulse width of a first clock signal. The detection information representing relationships in size between each of the plurality of delay amounts and the at least one of the high pulse width and the low pulse width of the first clock signal. A delay line control circuit coupled to the pulse width detection circuit and the delay line. The delay line control circuit configured to change a delay amount of the delay line by a step size determined responsive, at least in part, to the detection information.

17 Claims, 12 Drawing Sheets

(56) References Cited

U.S. PATENT DOCUMENTS

2014/0097880 A1  4/2014  Willey et al.
2016/0269012 A1  9/2016  Takahashi

* cited by examiner

SYNCHRONIZED SEMICONDUCTOR DEVICE WITH PHASE ADJUSTMENT CIRCUIT

CROSS-REFERENCE TO RELATED APPLICATION(S)

This application is a continuation of U.S. patent application Ser. No. 14/645,257, filed Mar. 11, 2015, entitled "SYNCHRONIZED SEMICONDUCTOR DEVICE WITH PHASE ADJUSTMENT CIRCUIT," issued as U.S. Pat. No. 9,768,760 on Sep. 19, 2017. The afore-mentioned application and patent are incorporated by reference herein, in their entirety, and for any purposes.

BACKGROUND

Operations in certain semiconductor devices, such as dynamic random-access memory (DRAM), are typically driven according to an input clock cycle. In such devices, synchronizing, or "locking," the input clock signal with the output signal may improve performance of the device by ensuring that timing between the device output and external components is synchronized. Traditional methods for synchronizing clock cycles include using a delay-locked loop (DLL). Generally, a DLL includes a variable chain of delay gates that can be applied to the signal in order to synchronize the internal clock with the external clock. Traditional methods include selecting a single step size (i.e. delay amount) and sequentially stepping the delay applied to the internal clock cycle and comparing the delayed internal clock cycle to the external clock in order to determine if the phases match.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Embodiments of the present invention recognize that traditional phase locking methods suffer from several shortcomings. Because the external clock signal is periodic, phase adjustment methods ideally adjust the phase of the output signal by an increment that is less than approximately half of the period of the external clock. Such an adjustment ensures that the phase adjustment does not over-adjust the phase of the output signal, which results in inefficient and time consuming locking. However, traditional phase locking methods do not measure the period of the external clock, which results in inefficient selection of delay step size. In an attempt to avoid over the phase of the output signal, traditional phase locking methods adjust the phase of the output signal by a relatively small step size. Although small step sizes typically avoid over-adjustment, they too are inefficient because the small step sizes may require a significant number of clock cycles before achieving a lock. That is, if the phase of the output clock must be adjusted by a significant amount of the external clock period, then a large number of incremental steps may be necessary to achieve a lock. Such methods may also be inefficiently time consuming. Embodiments disclosed herein provide a device for selecting a step size, or change in a delay applied by a DLL from one iteration to another, in order to minimize the number of clock cycles required to lock the internal clock phase with the external clock phase without risking over-adjusting the internal clock phase.

Figure 1:
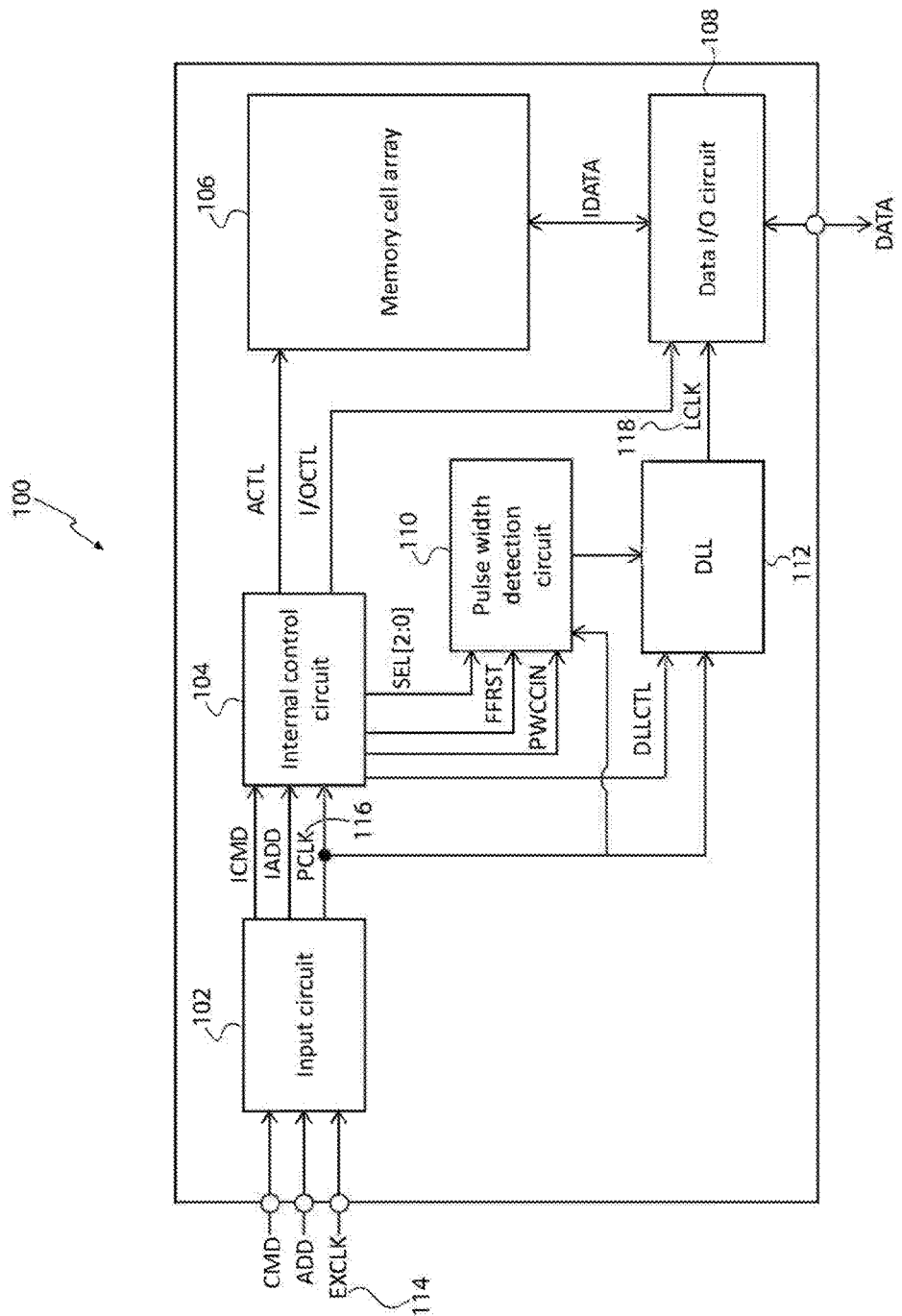
FIG. 1 depicts a functional block diagram of a semiconductor memory device, in accordance with an embodiment of the present invention.

Embodiments of the present invention will be described with reference to the drawings. FIG. 1 depicts a function block diagram of a semiconductor memory device, generally designated 100, in accordance with an embodiment of the present invention. In the embodiment of FIG. 1, memory device 100 includes input circuit 102, internal control circuit 104, memory cell array 106, data I/O circuit 108, pulse width detection circuit 110, and DLL 112.

In the depicted embodiment, input circuit 102 receives signals from an external source, such as a processor and/or memory controller, and provides signals for use by internal components of the memory device 100. For example, input circuit 102 may receive command information (CMD), address information (ADD), and an external clock signal 114. Input circuit 102 may then provide internal command information (ICMD), internal address information (IADD), and internal clock signal 116. Command information may include, example, active command information, write command information, and read command information. Similarly, internal command information may include internal active command information, internal write command information, and internal read command information. Address information may include row and column address information, while internal address information may include internal row and column address information. In various embodiments, external clock 114 represents the clock according to which command information and address information are provided to memory device 100. Internal clock 116 may be used by internal control circuit 104 and other components of memory device 100 for performing various functions.

Internal control circuit 104 generally controls operations of memory cell array 106 and data I/O circuit 108, as well as pulse width detection circuit 110 and DLL 112. Internal control circuit 104 may receive and process internal command information and internal address information from input circuit 102 and provide control signals to memory cell array 106 and data I/O circuit 108. The internal control circuit 104 may also provide control signals to pulse width detection circuit 110, such as selector signals, reset signals, and/or pulse width test signals. Similarly, internal control circuit 104 may provide DLL control signals to DLL 112.

Memory cell array 106 is an arrangement of individual memory cells. In various embodiments, memory cell array 106 may include a grid of memory cells for storing bits of information. Memory cell array 106 may perform read and/or write operations in accordance with instructions received from internal control circuit 104. In certain embodiments, memory cell array 106 outputs the values stored on one or more bits to data I/O circuit 108 in response to read commands received from internal control circuit 104. Data I/O circuit 108 generally provides a connection between memory cell array 106 and components outside of memory device 100. For example, during a read operation, data I/O circuit 108 outputs data corresponding to one or more bits of data received from memory cell array 106. During a write operation, data I/O circuit 108 receives one or more bits of information from external components and provides the information to memory cell array 106 to be stored. Operations of data I/O circuit are typically synchronized with a clock signal, such as DLL output signal 118. Often, synchronizing the operations of data I/O circuit 108 with the external clock cycle 114 is preferable. As described further detail below, pulse width detection circuit 110 and DLL 112 adjust the timing of internal clock 116 in order to provide DLL, output signal 118 for use by data I/O circuit 108 to provide or receive data synchronized with the external clock cycle 114.

Pulse width detection circuit 110 is a circuit that compares the high and low pulse widths of internal clock 116 with one or more possible step sizes of DLL 112 to provide the DLL 112 with a step size for facilitating a lock between external clock 114 and internal clock 116. As discussed in further detail below with respect to FIGS. 2-5, pulse width detection circuit 110 may receive as inputs internal clock 116, one or more selector signals, a reset signal, and a pulse width test signal. Pulse width detection circuit 110 may then provide step size information to DLL 112 for use in synchronizing internal clock 116 with external clock 114. As noted above, selecting the correct step size for use by DLL 112 requires a delicate balance because selecting too large of a step size may result in over-adjusting the phase of internal clock 116, while selecting too small of a step size requires an inefficient amount of time to achieve a lock.

DLL 112 is a delay-locked loop circuit capable of applying a phase shift to an internal clock signal 116 in order to synchronize internal clock 116 with external clock 114. As discussed in further detail below, DLL 112 may employ a variable delay circuit in order to provide the phase shift in internal clock signal 116, DLL 112 may further receive instructions for how to adjust the variable delay circuit from pulse width detection circuit 110.

Figure 2:
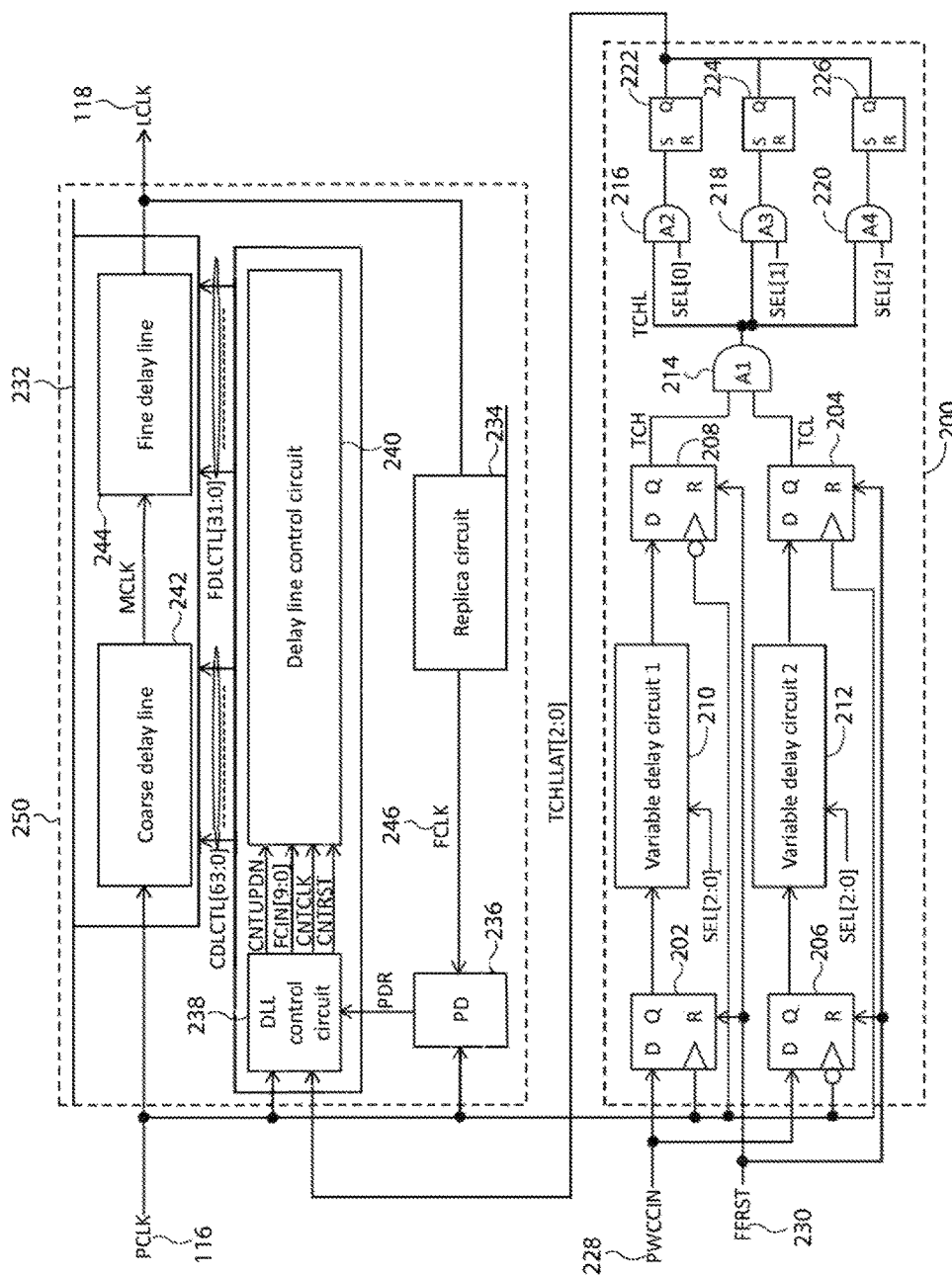
FIG. 2 depicts a functional block diagram of a pulse width detection circuit and a delay-locked loop circuit, in accordance with an embodiment of the present invention.

FIG. 2 depicts a functional block diagram of pulse width detection circuit 200 and DLL 250, in accordance with an embodiment of the present invention. In some embodiments, the detection circuit 200 may be used to implement the pulse width detection circuit 110, and the DLL 250 may be used to implement the DLL 112.

Pulse width detection circuit 200 generally includes rising edge flip-flops 202 and 204, variable delay circuits 210 and 212, falling edge flip-flops 206 and 208, AND gate 214, AND gates 216, 218, and 220, and latches 222, 224, and 226. Generally, the pulse width detection circuit 200 compares the width of each of the high and low portions of internal clock 116 with a delay in a mike width test signal 228 caused by variable delay circuit 210 or 212. To ensure that a lock can be achieved, pulse width detection circuit ensures that the step size of the DLL (that is the amount of time by which the DLL may sequentially step the delay applied to internal clock 116) is less than both the high portion and the low portion of internal clock signal 116. By ensuring that this condition is satisfied by the DLL, pulse width detection circuit 200 sets a maximum value for the step size based on the shorter of the high and low portions of the internal clock signal 116.

In the embodiment of FIG. 2, the data input of each flip-flop in pulse width detection circuit 200 begins with a low signal loaded. To test whether one of the possible step sizes of DLL 250 is less than the high portion of internal clock signal 116, internal control circuit 104 first provides a high test signal to a data input of rising edge flip-flop 202 via pulse width test signal 228. Rising edge flip-flop 202 may be, for example, a D-type flip-flop. In the depicted embodiment, rising edge flip-flop 202 is clocked in accordance with the rising edge of internal clock 116. Therefore, on the next transition of internal clock 116 from low to high, rising edge flip-flop 202 outputs the high signal of pulse width test signal 228 to variable delay circuit 210. In various embodiments, variable delay circuit 210 may represent different delay amounts which corresponds to the possible step sizes of DLL 250 and is an adjustable buffer that delays a signal by a determinable amount without changing a logic level of the output signal. An example variable delay circuit is described below with respect to FIG. 3. In certain embodiments, the delay applied by variable delay circuit 210 may be adjusted using one or more selector signals. In the embodiment of FIG. 2, three possible selector signals are shown (SEL[0], SEL[1], and SEL[2]), but any number of selector signals are possible.

Variable delay circuit 210 delivers the delayed pulse width test signal 228 to a data input of failing edge flip-flop 208. Falling edge flip-flop 208 may be, for example, a D-type flip-flop. Falling edge flip-flop 208 is clocked in accordance with the falling edge of internal clock 116. Therefore, failing edge flip-flop 208 outputs whatever signal is present in its data input when internal clock 116 transitions from high to low. If variable delay circuit 210 delays the output of rising edge flip-flop by a time period longer than the high pulse width of internal clock 116, then falling edge flip-flop 208 outputs a low signal because the high signal of pulse width test signal 228 has yet to reach falling edge flip-flop 208. In this case, the possible step size, which represents the time period, is too large. Alternatively, if variable delay circuit 210 delays pulse width test signal 228 by an amount shorter than the high portion of internal clock signal 116, then the delayed pulse width test signal 228 will reach falling edge flip-flop before internal clock signal 116 transitions from high to low. In this case, failing edge flip-flop 208 outputs a high signal. Therefore, falling edge flip-flop 208 provides an output based on whether the possible step size, which corresponds to the amount by which variable delay circuit 210 delays pulse width test signal 228, is longer than or shorter than the high pulse width of internal clock 116.

In a similar manner, pulse width detection circuit 200 determines whether a possible step size is longer than or shorter than the low portion of internal clock 116. Internal control circuit 104 provides a high signal to falling edge flip-flop 206 via pulse width test signal 228. Falling edge flip-flop 208 may be, for example, a D-type flip-flop. When internal clock 116 transitions from high to low, falling edge flip-flop 206 outputs pulse width test signal 228 to variable delay circuit 212. In the embodiment of FIG. 2, variable delay circuit 212 delays pulse width test signal 228 by an amount equal to that of variable delay circuit 210. Variable delay circuit 212 outputs a delayed pulse width test signal 228 to the data input of rising edge flip-flop 204. Rising edge flip-flop 204 may be, for example, a D-type flip-flop. Rising edge flip-flop 204 outputs the current state of its data input when internal clock 116 transitions from low to high. Therefore, if variable delay circuit 212 delays pulse width test signal 228 by an amount of time longer than the low portion of the internal clock signal 116, then rising edge flip-flop 204 outputs a low signal. Similarly, if variable delay circuit 212 delays pulse width test signal 228 by an amount of time shorter than the low portion of internal clock signal 116, then rising edge flip-flop 204 outputs a high signal.

As discussed above, the step size of DLL 250 may ideally be smaller than both the high and low portions of the internal clock signal 116. In the embodiment of FIG. 2, pulse width detection circuit 200 includes AND gate 214, which compares the outputs of failing edge flip-flop 208 and rising edge flip-flop 204 and outputs a high signal if both of the flip-flops 208 and 204 output high signals. By this mechanism, pulse width detection circuit 200 ensures whether the possible step size, which corresponds to the amount by which variable delay circuits 210 and 212 delay pulse width test signal 228, is less than both the high and low portions of internal clock signal 116.

As discussed above, variable delay circuits 210 and 212 may be adjusted by applying one or more selector signals. Selector signals may correspond to different delay amounts in variable delay circuits 210 and 212. In order to correlate the output from AND gate 214 with the correct delay amount applied by variable delay circuits 210 and 212, pulse width detection circuit 200 further includes AND gates 216, 218, and 220. Each of AND gates 216, 218, and 220 takes as inputs the output of AND gate 214 and one of the selector signals. AND gates 216, 218, and 220 may be activated to pass the output of AND gate 214 only if the respective selector signal is high. That is, in the embodiment of FIG. 2, only one of AND gates 216, 218, and 220 may be active at any given time because only one of the selector signals is high at a time. Each of AND gates 216, 218, and 220 outputs its signal to a corresponding latch 222, 224, and 226, which then output a bit string to DLL 250 describing which possible step size may be applied to DLL 250 so that DLL 250 may step internal clock 116 efficiently. In another embodiment, pulse width detection circuit 200 may sequentially test each of a plurality of possible step sizes corresponding to a plurality of selector signals. In this embodiment, each of latches 222, 224, and 226 is loaded sequentially with a value indicating whether the corresponding possible step size is less than both the high and low portions of internal clock 116. A single multi-bit string may then be provided to DLL 250 which details information on the possible step sizes. In such an embodiment, DLL 250 may then process the received multi-bit string to determine what the largest acceptable step size is that may be applied to DLL 250.

Figure 3:
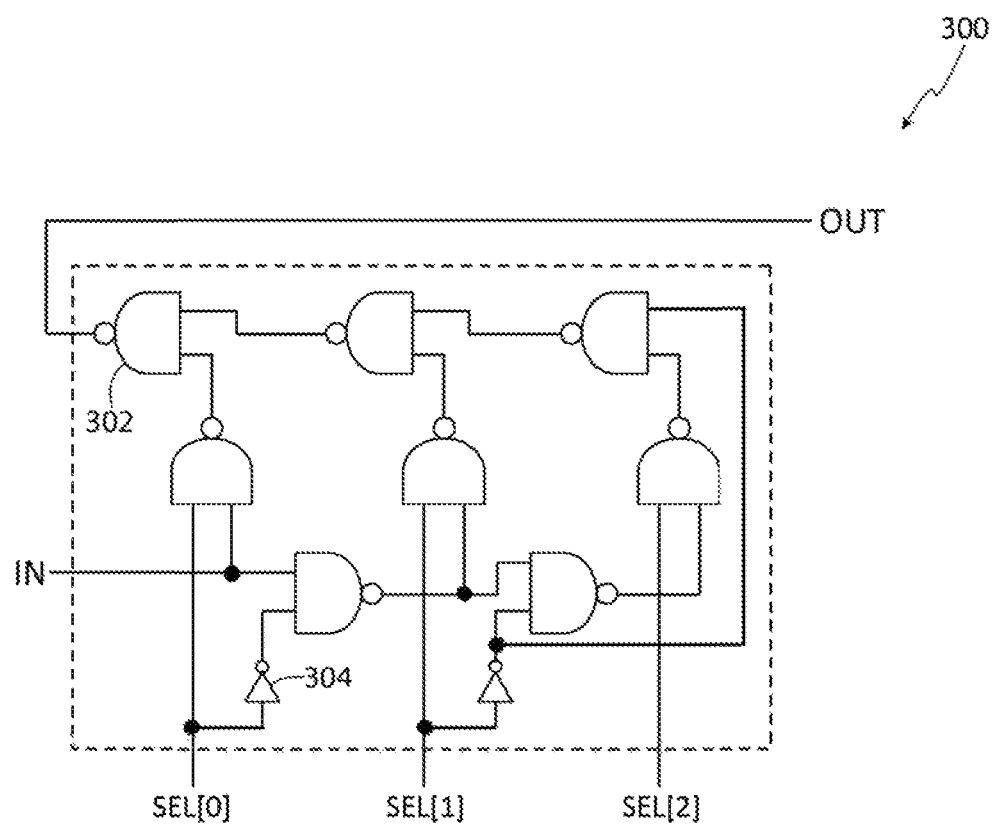
FIG. 3 depicts a schematic diagram of an example variable delay circuit, for use in a pulse width detection circuit, in accordance with an embodiment of the present invention.

FIG. 3 depicts an example variable delay circuit 300, in accordance with an embodiment of the present invention. The variable delay line circuit 300 may be used in pulse width detection circuit 110. In the depicted embodiment, variable delay circuit 300 includes a number of NAND gates 302, as well as a number of inverters 304. A number of selector signals SEL[0]-SEL[2] may selectively increase or decrease the amount of delay applied by variable delay circuit 300. As would be appreciated by one skilled in the art, the depicted variable delay circuit 300 is only one of many possible configurations. Other embodiments may include more gates, inverters, selector signals, and for other components not shown to increase or decrease the delay of variable delay circuit 300. In certain embodiments, each selector signal activates one or more NAND gates 302. Each NAND gate 302, or a set of NAND gates 302 may correspond to a unitary delay amount that may be the shortest delay applied to a clock signal. Therefore, a given selector signal may correspond to an integer multiple of the unitary delay amount and the subsequent selector signal may represent an integer multiple one higher than the previous selector signal. For example, SEL[1] may correspond to a delay amount of two times the unitary delay amount. That is, the integer multiple for SEL[1] is two. Similarly, SEL[2] may correspond to a delay amount of three times the unitary delay amount. That is, the integer multiple of SEL[2] is equal to one plus the integer multiple of SEL[1]. Pulse width detection circuit 200 may test one or more consecutive selector signals.

Figure 4:
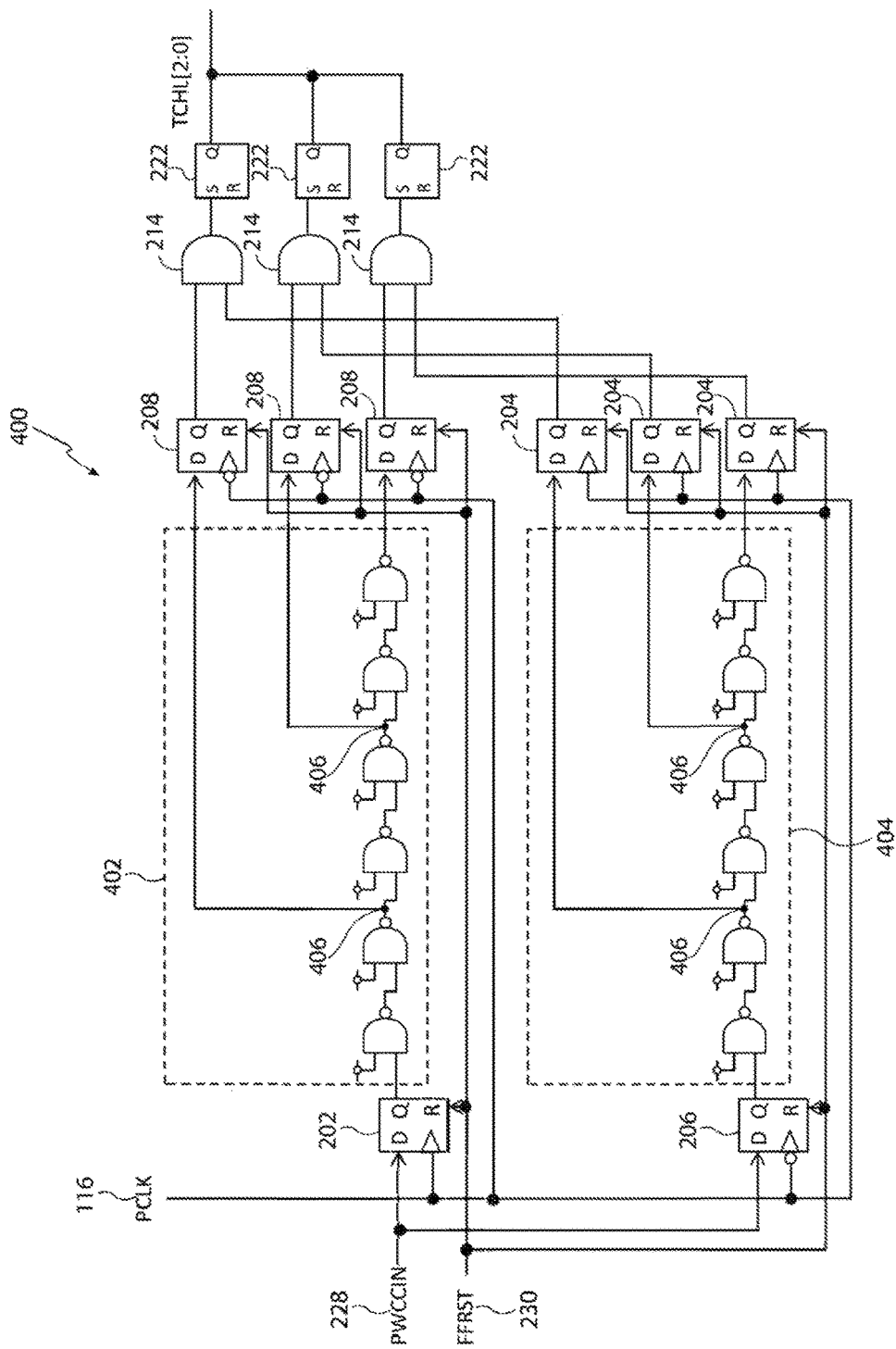
FIG. 4 depicts a schematic diagram of a pulse width detection circuit, in accordance with an embodiment of the present invention.

FIG. 4 depicts a pulse width detection circuit, generally designated 400, in accordance with another example embodiment of the present invention. In various embodiments, pulse width detection circuit 400 may be implemented as pulse width detection circuit 110. The embodiment of FIG. 4 includes fixed delay circuits 402 and 404 in lieu of variable delay circuits 210 and 212 (see FIG. 2). In this embodiment, fixed delay circuit 402 includes a delay circuit that delays a pulse width test signal 228 received from rising edge flip-flop 202. In the depicted embodiment, the delay circuit includes a plurality of NAND gates. However, in other embodiments, other circuit elements may be used. Fixed delay circuit 402 may include multiple test points 406 positioned at intervals in the delay circuit. Such test points may feed data to a plurality of falling edge flip-flops 208. Each test point corresponds to a different delay amount, applied to pulse width test signal 228. By virtue of the multiple test points 406 and multiple falling edge flip-flops 208, pulse width detection circuit 400 may simultaneously compare multiple possible step sizes of a DLL, such as DLL 112, (equal to the delay applied at each test point 406) with the pulse width of the high portion of internal clock 116. Fixed delay circuit 404 operates identically to fixed delay circuit 402, except that fixed delay circuit 404 is used in conjunction with falling edge flip-flop 206 and rising edge flip-flops 204 to test whether various possible step sizes of the DLL are shorter than the low portion of internal clock 116.

Each of falling edge flip-flops 208 outputs a high signal if the delay caused by fixed delay circuit 402 at respective test points is less than the high pulse width of internal clock 116. That is, each falling edge flip-flop 208 corresponds to one test point 406. Similarly, each of rising edge flip-flops 204 outputs a high signal if the delay caused by fixed delay circuit 404 at respective test points is less than the low pulse width of internal clock 116. AND gates 214 may then determine whether the delay at a given test point 406 is less than both the high and low pulse widths of internal clock 116. The outputs of AND gates 214 may then be provided to latches 222. Finally, latches 222 may output a signal to the DLL 250 for processing to determine the largest acceptable step size to step internal clock 116.

Figure 5:
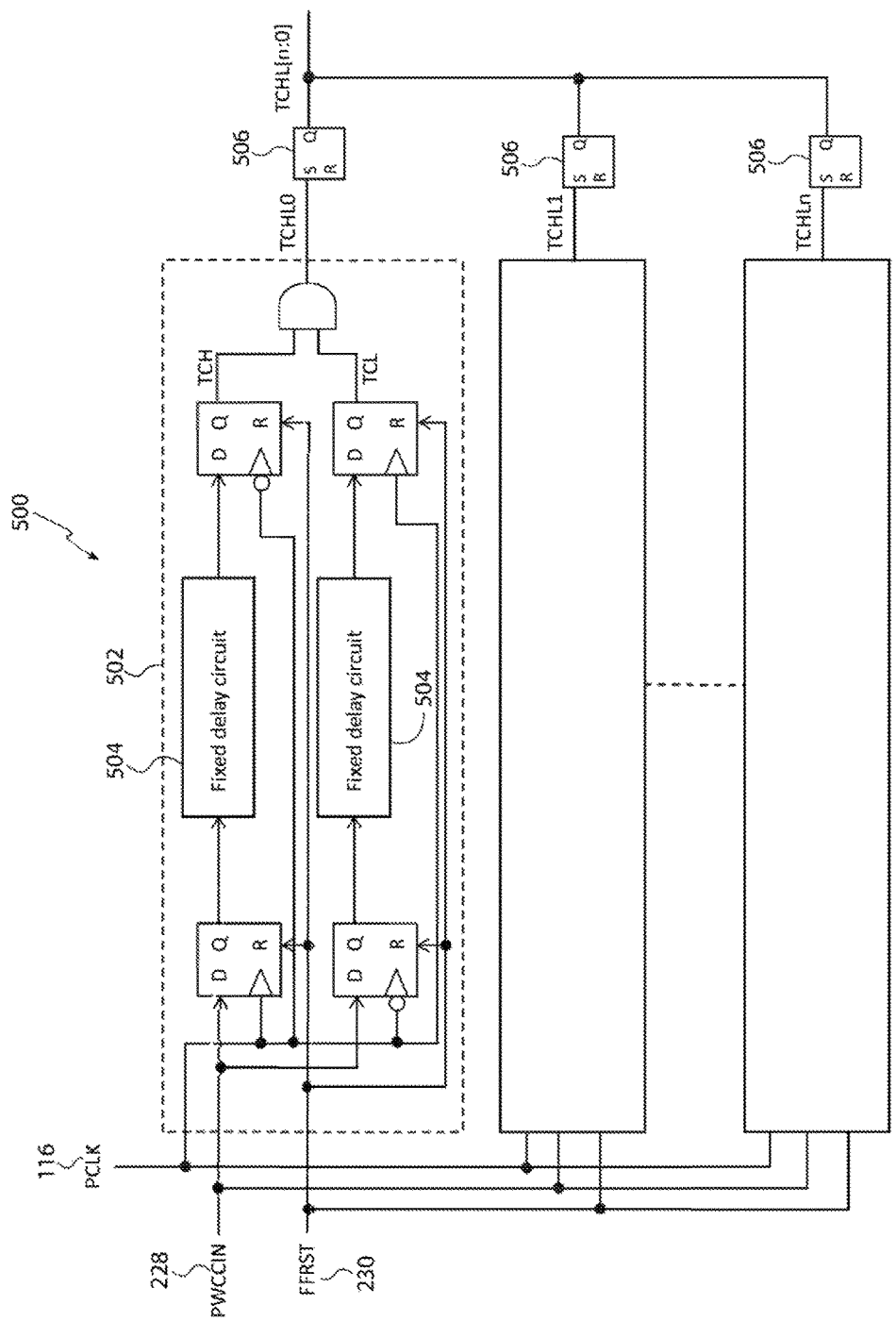
FIG. 5 depicts a functional block diagram of a pulse width detection circuit, in accordance with an embodiment of the present invention.

FIG. 5 depicts a pulse width detection circuit, generally designated 500, in accordance with yet another embodiment of the present invention. The embodiment of FIG. 5 employs a plurality of pulse width comparison circuits 502, arranged in parallel, to simultaneously test multiple possible step sizes. Each pulse width comparison circuit 502 compares a single possible step size, determined by the delay of a respective fixed delay circuit 504, with both the high and low portions of internal clock signal 116 using rising edge and falling edge flip-flops as in FIGS. 2-4. Each pulse width comparison circuit 502 outputs a high signal if the delay of fixed delay circuits 504 is less than both the high and low portions of the internal clock signal 116. Each pulse width comparison circuit 502 outputs its signal to a latch 506. Latches 506 then combine the received output signals into a multi-bit number and provide that multi-bit number to a DLL, such as DLL 112, for processing to select the largest acceptable step size by which the DLL may step an internal clock, such as internal clock 116.

Figure 6:
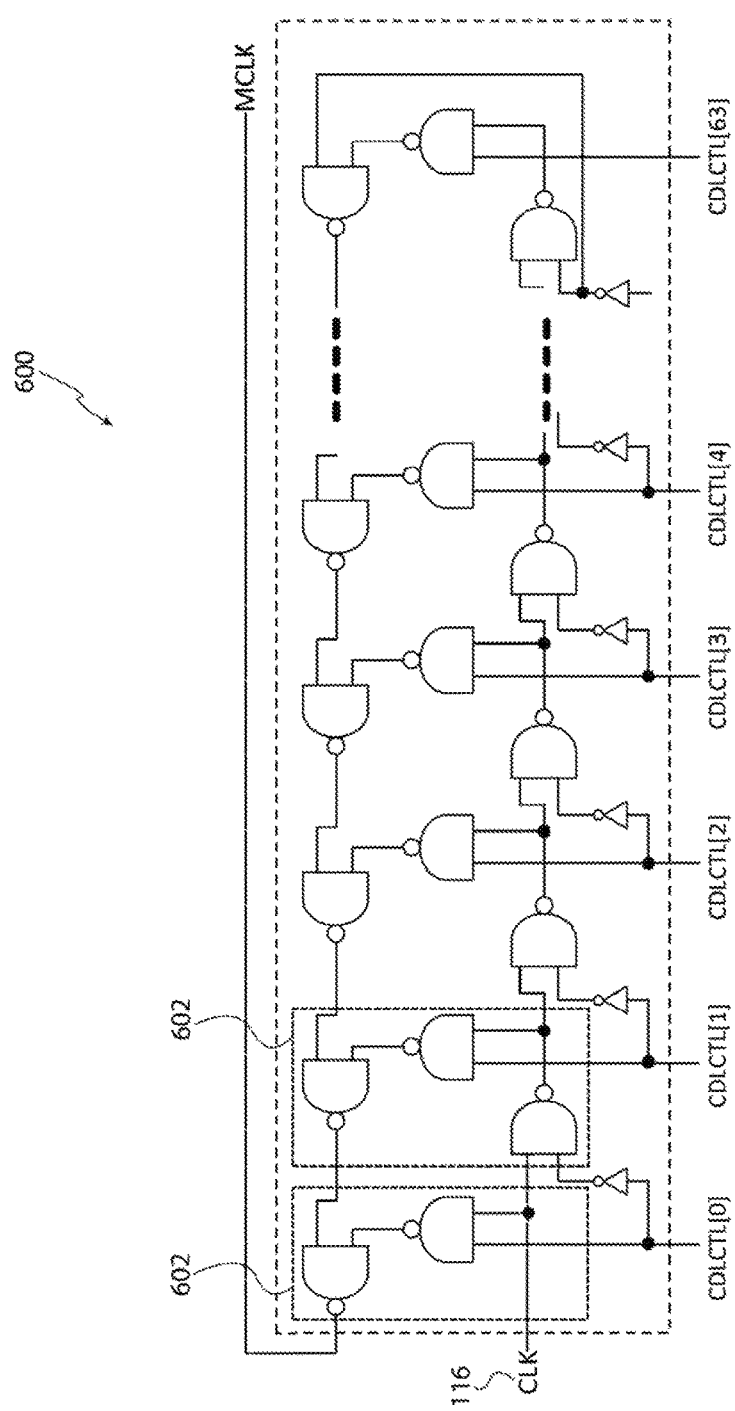
FIG. 6 depicts a schematic diagram of an example coarse delay line, in accordance with an embodiment of the present invention.

Returning again to FIG. 2, DLL 250 may include delay line 232, replica circuit 234, phase detector 236, DLL control circuit 238, and delay line control circuit 240. Delay line 232 provides a DLL output signal 118 by delaying internal clock signal 116. Delay line 232 may set and change, in a stepwise fashion, a delay amount in response to delay control information received from delay line control circuit 240 (discussed below). Delay line 232 may include coarse delay line 242 and fine delay line 244. Coarse delay line 242 may provide an intermediate clock signal by delaying internal clock 116. Fine delay line 232 may receive the intermediate clock signal and apply an additional delay to the intermediate clock signal before outputting output signal 118. In one embodiment coarse delay line 242 includes 64 delay units that may be applied to internal clock signal 116, and fine delay line includes 32 delay units. FIG. 6 depicts an example coarse delay line 600, in accordance with an embodiment of the present invention. In various embodiments, coarse delay line 600 may be implemented as coarse delay line 242. As shown in FIG. 6, coarse delay line 600 may include a number of circuit elements arranged in a plurality of unit delay circuits 602 which may be applied or not applied to internal clock 116, as controlled by a respective control signal CDLCTL[0]-CDLCTL[63]. In the embodiment of FIG. 6, coarse delay line 600 includes 64 unit delay circuits. As will be appreciated by one skilled in the art, similar unit delay circuits may be used in fine delay circuit 244.

DLL 112 further includes replica circuit 234. Replica circuit 234 may model a delay time equivalent to various delays along a path beginning where external clock 114 enters memory device 100, through input circuit 102, DLL 112, and data I/O circuit 108. Replica circuit 234 delays DLL output signal 118 by such an amount and provides a delayed internal clock signal 246 to phase detector 236. In various embodiments, phase detector 236 compares the phases of delayed internal clock signal 246 with the phase of internal clock signal 116. Phase detector 236 may output the results of the comparison between delayed internal clock signal 246 and the internal clock signal 116 to DLL control circuit 238.

DLL control circuit 238 receives the internal clock 116, and input signals from phase detector 236 and pulse width detection circuit 110. Based at least on these inputs, DLL control circuit 238 outputs instructions to delay line control circuit 240, which provides instructions to delay line 232 to control the delay applied to internal clock 116. DLL control circuit 238 is described in further detail with respect to FIGS. 7 and 8. In one embodiment, DLL control circuit receives information from pulse width detection circuit 110 which details the largest acceptable step size that is smaller than both the high and low portions of the pulse width of internal clock 116. DLL control circuit 238 may provide instructions to delay line control circuit 240 to apply the received step size (i.e., the largest acceptable step size) to change the delay amount of delay line 232 and then to increase or decrease, in a stepwise fashion, the delay applied to internal clock 116 responsive, at least in part, to the largest acceptable step size according to ordinary DLL function until a lock is achieved between internal clock 116 and external clock 114.

Figure 7:
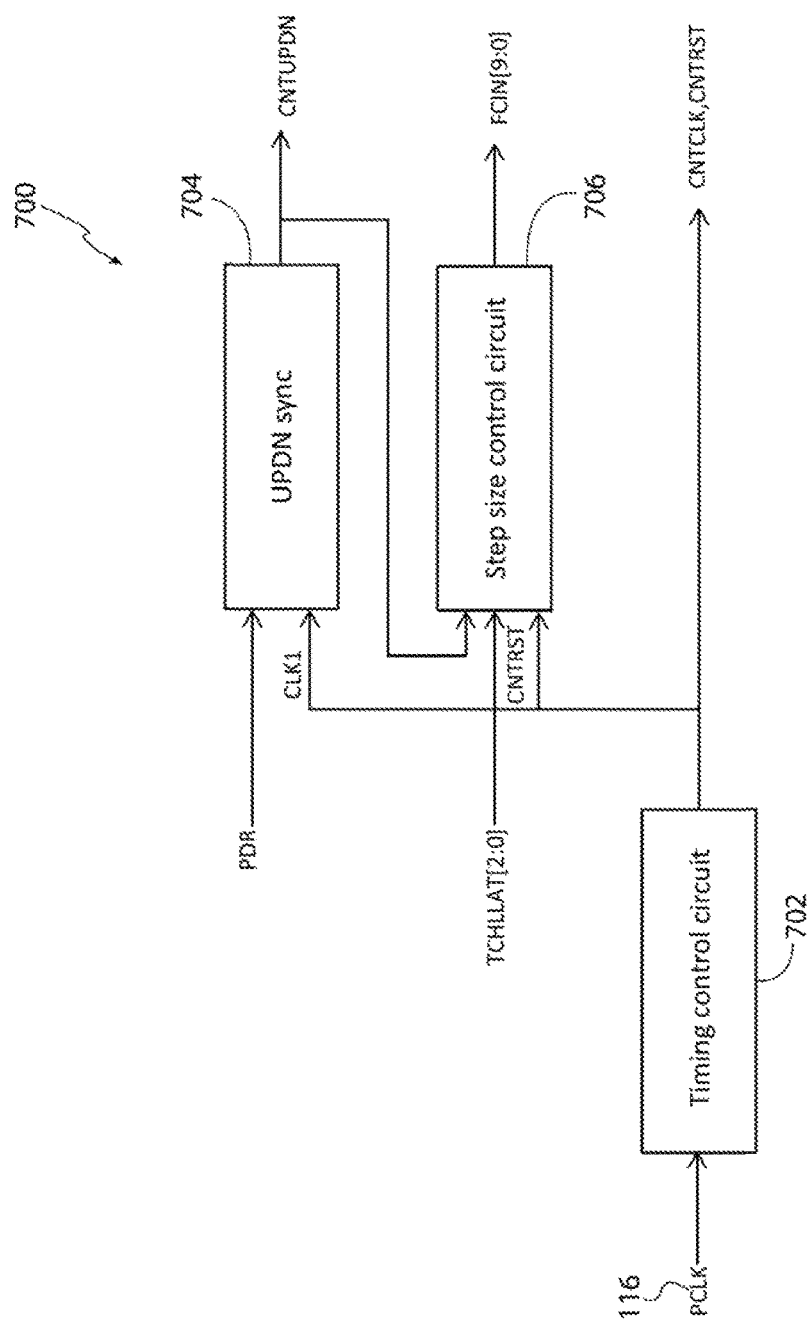
FIG. 7 depicts a functional block diagram of a delay-locked loop control circuit, in accordance with an embodiment of the present invention.

FIG. 7 depicts a functional block diagram of DLL control circuit 700, in accordance with an embodiment of the present invention. The DLL control circuit 700 may be used for the DLL control circuit 238. In the embodiment of FIG. 7, DLL control circuit 700 includes timing control circuit 702, up/down sync circuit 704, and step size control circuit 706. Timing control circuit 702 provides a sync clock signal 708 for up/down sync circuit 704 and a counter clock signal in accordance with internal clock 116. The sync clock signal 708 may be synchronized with the counter clock signal. Timing control circuit 702 may further provide a count reset signal in accordance with internal clock 116. Up/down sync circuit 704 synchronizes the output of phase detector circuit 236 with the counter clock signal by using the sync clock signal. Up/down sync circuit 704 may output an up/down count signal for use by delay line control circuit 240. Step size control circuit 706 is described in further detail with respect to FIG. 8.

Figure 8:
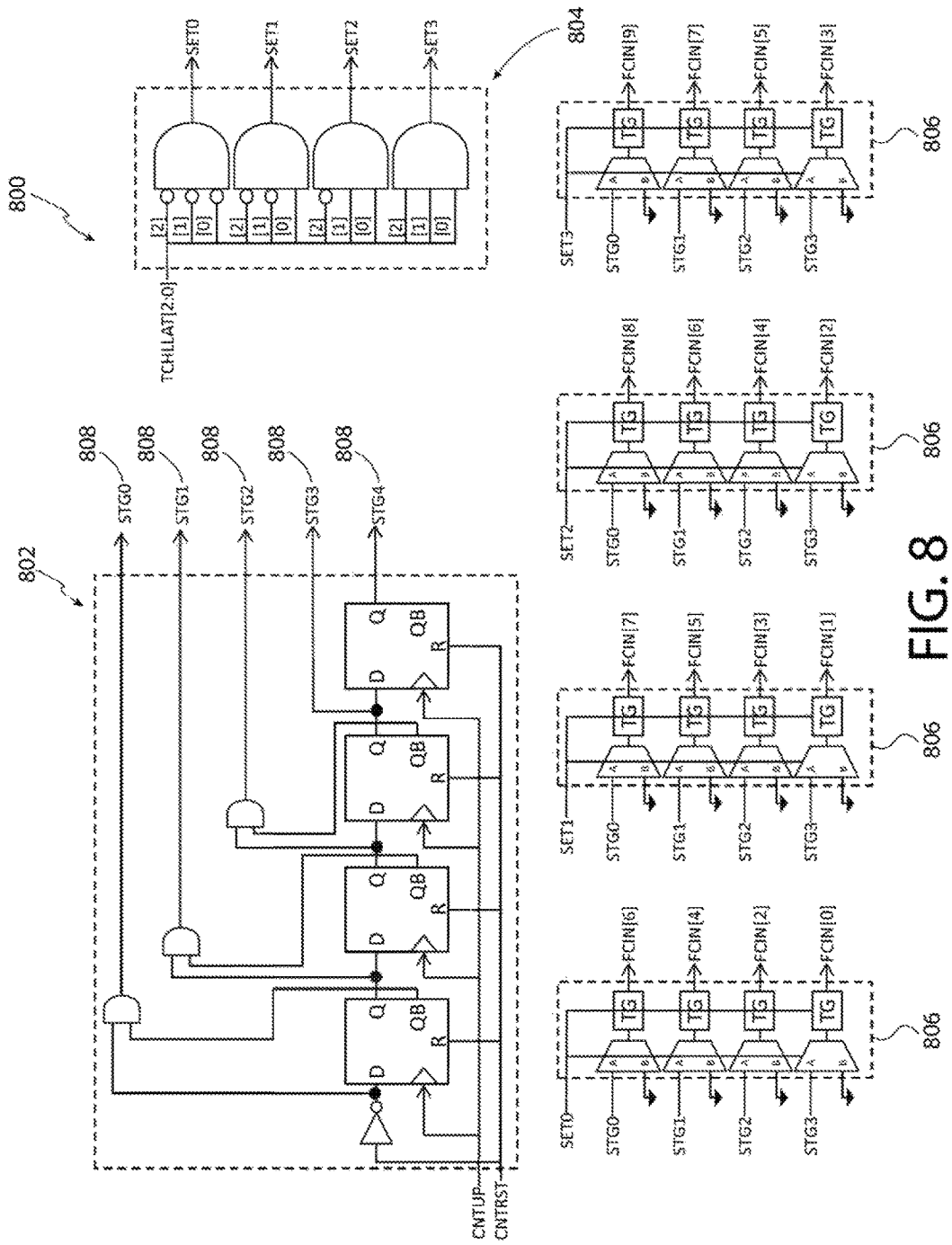
FIG. 8 depicts a schematic diagram of a step size control circuit, in accordance with an embodiment of the present invention.

FIG. 8 depicts step size control circuit 800, in accordance with an embodiment of the present invention. The step size control circuit 800 may be used for the step size control circuit 706. In the embodiment of FIG. 8, step size control circuit 800 includes stage signal generation circuit 802, decoder circuit 804, and four selector circuits 806. Stage signal generation circuit 802 may detect toggling of the up/down count signal provided by up/down sync circuit 704. Stage signal generation circuit 802 may selectively activate one stage signal 808 and sequentially change the activated stage signal 808 in response to detecting toggling of the up and/or down count signal from up down sync circuit 704. Generally, stage signals 808 provide an indication of how close DLL 112 currently is to achieving a lock between internal clock 116 and external clock 114. For example, stage signal control circuit 802 may sequentially activate STG0 to STG1 to STG2 to STG3 to STG4, where an active STG4 indicates a lock between internal clock 116 and external clock 114. In one embodiment, STG3 and STG4 being active at the same time indicates a lock between internal clock 116 and external clock 114. Stage signal generation circuit 802 may be reset based on a reset signal.

Step size control circuit 800 may further include decoder circuit 804 for decoding the output signal of pulse width detection circuit 110. As discussed above with respect to FIGS. 2-5, pulse width detection circuit 110 may output a multibit output signal that describes which one of a number of possible step sizes are the largest acceptable step size. Decoder circuit 804 receives this output signal and converts it into a number of outputs. In the depleted embodiment, decoder circuit 804 includes a plurality of circuit elements. In one embodiment, the decoder 804 may include a number of AND gates for decoding the multibit signal. The plurality of circuit elements may be selectively activated depending on different combinations of hits included in the multibit output signal.

Step size control circuit 800 may further include a plurality of selector circuits 806. In various embodiments, step size control circuit 800 includes one selector circuit for each output signal of decoder 804. For example, if decoder 804 outputs four signals, then step size control circuit 800 includes four selector circuits. In the depicted embodiment, each selector circuit 806 receives as inputs each of the stage signals 808 output by stage signal generation circuit 802 and different one of the SET signals output by decoder 804 (e.g., SET1). Each selector circuit 806 may output a number of forced carry input (FCIN) signals corresponding to the input stage signals 808 received from stage signal generation circuit 802. Each selector circuit 806 may include a multiplexor which acts as a selector for each stage signal 806. Selector circuit 806 may selectively activate an FCIN in response to the activation of stage signals 808 by stage signal generation circuit 802 and SET signals by decoder 804. Each of the FCIN signals may indicate an associated step size by designating a corresponding counter bit of an up/down counter circuit in a delay line control circuit, such as delay line control circuit 240. In one embodiment, the FCIN signals corresponding to STG signal of each selector circuit 806 may correspond to an associated possible step size tested by a pulse width detection circuit, such as pulse width detection circuit 110. In various embodiments, selector circuits 806 change through FCINs corresponding to larger step sizes to FCINs corresponding to smaller step sizes. In such embodiments, the delay amount applied by delay line 232 decreases with toggling of the up/down count signal. By this sequential operation, an adjustment accuracy of DLL may change from coarser accuracy to finer accuracy in a step-by-step manner. DLL control circuit 238 outputs the FCIN signals, the up/down count signal, and outputs of timing control circuit 702 to delay line control circuit 240.

Figure 9:
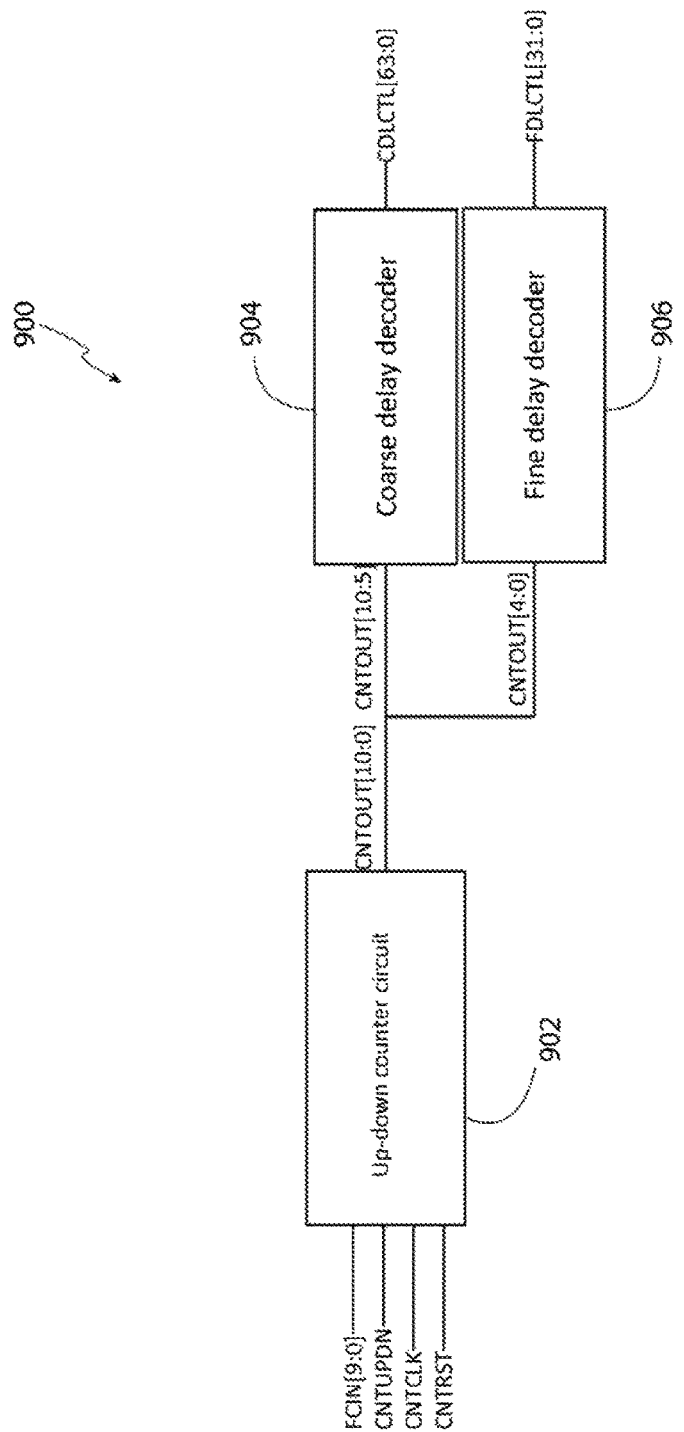
FIG. 9 depicts a functional block diagram of a delay line control circuit, in accordance with an embodiment of the present invention.

FIG. 9 depicts a functional block diagram of delay line control circuit 900, in accordance with an embodiment of the present invention. The delay line control circuit 900 may be used for the delay line control circuit 240. In the embodiment of FIG. 9, delay line control circuit 900 includes up/down counter circuit 902, coarse delay decoder 904, and fine delay decoder 906. Up/down counter circuit 902 may be an 11 bit circuit including six bits for adjusting coarse delay line 242, and five bits for adjusting fine delay line 244. Up/down counter circuit 902 may update a count value by changing a counter bit which is equal to or greater than that designated by an applied FCIN signal output by step size control circuit 800 without changing smaller counter bit than the designated counter bit. In this mechanism, delay line control circuit 900 may change the delay of a delay line, such as delay line 232, by the step size corresponding to the applied FCIN signal. Coarse delay decoder 904 may be a 6-64 decoder for selectively adjusting the delay of coarse delay line 242. Fine delay decoder is a 5-32 decoder for selectively adjusting the delay of fine delay line 244. As will be appreciated by one skilled in the art, coarse delay decoder 904 and fine delay decoder 906 may be configured to selectively activate or deactivate specific unit delay circuits 602 in order to increase or decrease the delay applied to internal clock 116 as it passes through delay line 232.

Figure 10:
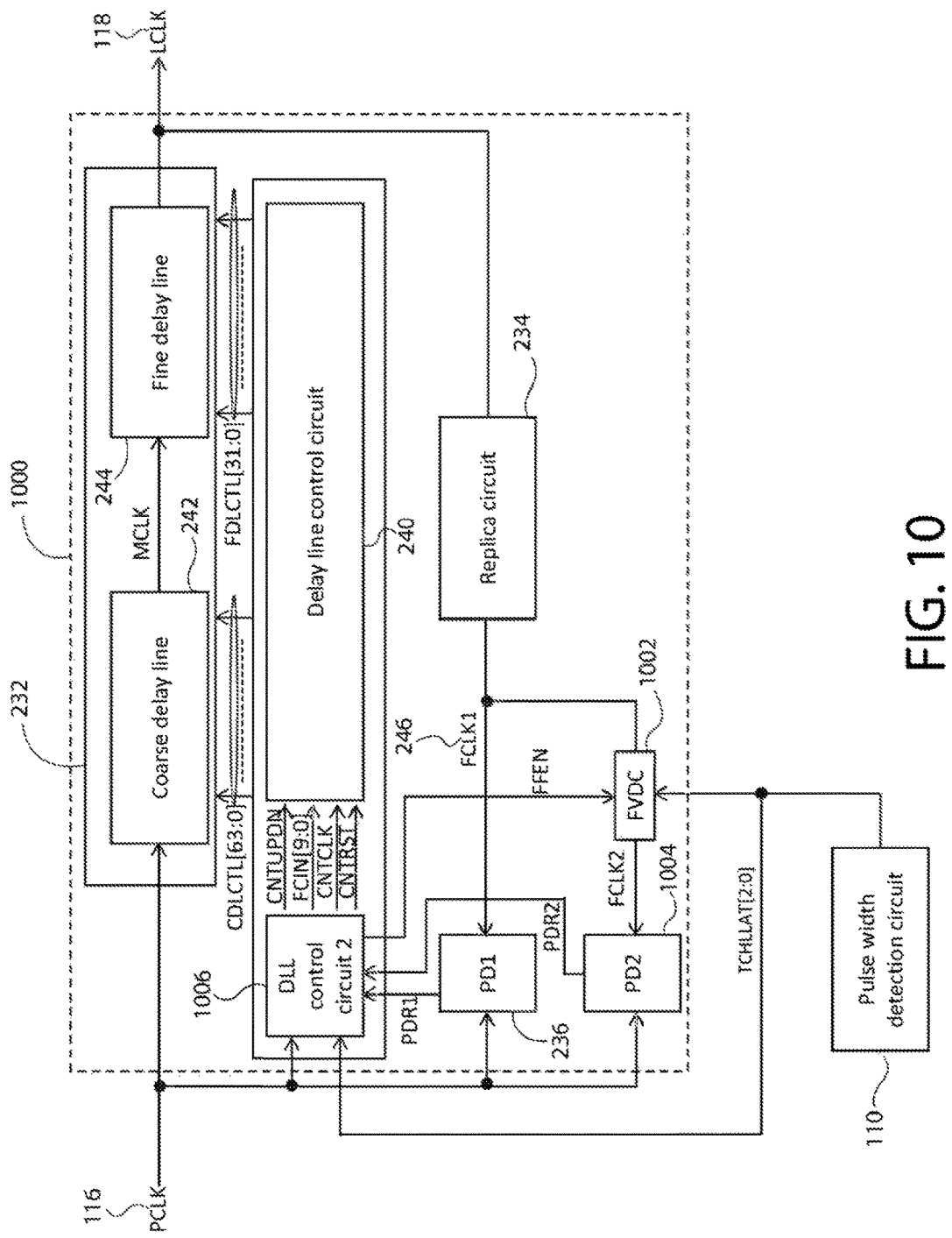
FIG. 10 depicts a functional block diagram of a delay-locked loop circuit with a feedback variable delay circuit, in accordance with an embodiment of the present invention.
Figure 12:
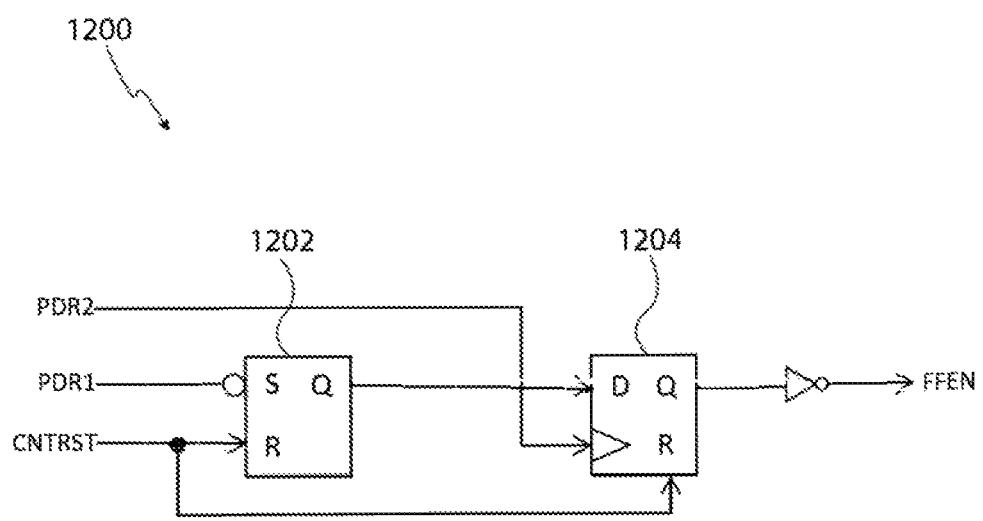
FIG. 12 depicts a schematic diagram of a feedback circuit control circuit generator, in accordance with an embodiment of the present invention.

FIG. 10 depicts a functional block diagram of DLL 1000 with a feedback variable delay circuit, in accordance with another embodiment of the present invention. In the embodiment of FIG. 12, DLL 1000 includes feedback variable delay circuit 1002, a second phase detector 1004, and DLL control circuit 1006. Feedback variable delay circuit 1002 provides a feedback clock signal 1008 by applying an additional delay to delayed internal clock signal 246, provided by replica circuit 234. Feedback variable delay circuit 1002 may include a decoder that decodes the output signal of pulse width detection circuit 110 and provides a variable delay based on the received output signal. Second phase detector 1004 operates essentially the same as phase detector 236, except that second phase detector 1004 compares the phase of internal clock 116 with the phase of feedback clock signal 1008 and provides the result to DLL control circuit 1006.

Figure 11:
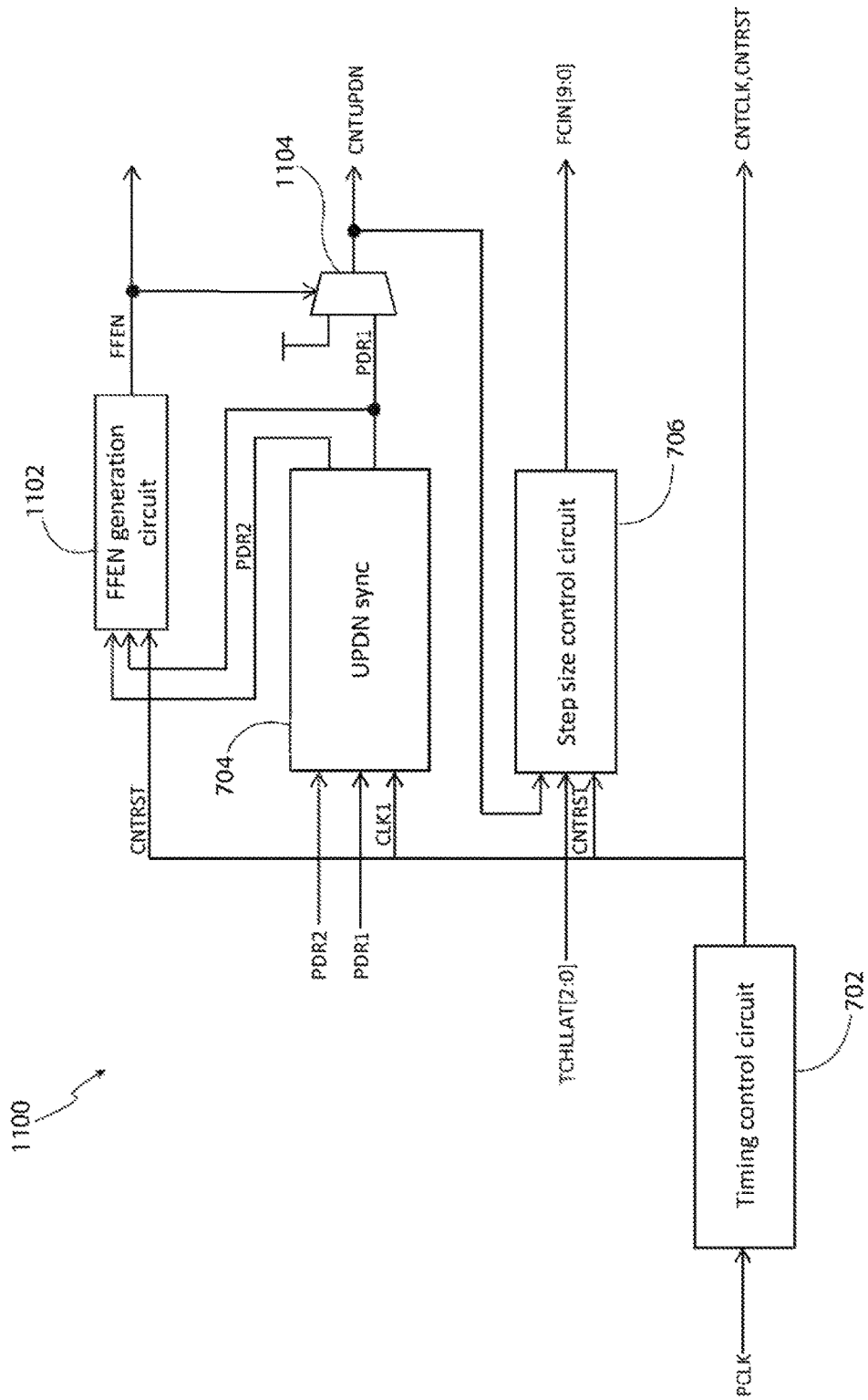
FIG. 11 depicts a functional block diagram of a delay-locked loop control circuit, in accordance with the embodiment of FIG. 10.

FIG. 11 depicts a functional block diagram of DLL control circuit 1100, in accordance with an embodiment of the present invention. In various embodiments, control circuit 1100 may be implemented as DLL control circuit 1006. DLL control circuit 1100 may include components similar to DLL control circuit 238, and additionally FFEN generation circuit 1102 and selector 1104. FFEN generation circuit 1102 may provide a control signal and apply the control signal to the control node of selector 1104 and feedback variable delay circuit 1002. Selector 1104 may output one of the output of phase detector 236 and a high signal depending on the input from FFEN generation circuit. In one embodiment, selector 1104 outputs a high signal when FFEN generation circuit 1102 outputs a high signal, and selector 1104 outputs the output of phase detector 236 when FFEN generation circuit 1102 outputs a low signal. The output of selector 1104 may be used as up/down signal 1110, as described above with respect to FIG. 11.

FIG. 12 is a schematic view of FFEN generation circuit 1200, in accordance with an embodiment of the present invention. In various embodiments, FFEN generation circuit 1200 may be implemented as FFEN generation circuit 1102. FFEN generation circuit 1200 includes an SR flip-flop 1202 and a D flip-flop 1204. When both flip-flops are reset, the output of each flip-flop is set to a low value and the output signal FFEN is high. The output of SR flip-flop 1202 transitions from low to high when the output of phase detector 236 transitions from high to low. The output of D flip-flop 1204 transitions from low to high when the output of phase detector 1004 transitions from low to high after the output of SR flip-flop 1202 transitions to high. When the output of D flip-flop 1204 is high, the output of FFEN generation circuit 1200 is low, which may be used to deactivate feedback variable delay circuit 1002.

Delay lines in accordance with embodiments of the present invention may be used in any of a variety of semiconductor device including, but not limited to, semiconductor memories, such as DRAM, SRAM, NOR flash memory, NAND flash memory, phase change memory and resistance random access memory, CPUs, MPUs, AISICs and semiconductor sensor circuit, such as image sensor.

Semiconductor memory devises in accordance with embodiments of the present invention may be used in any of a variety of electronic devises including, but not limited to, computing systems, electronic storage systems, cameras, phones, wireless devices, displays, chip sets, set top boxes, or gaming systems.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus comprising:
a pulse width detection circuit configured to provide detection information responsive to a plurality of delay amounts being different from one another and at least one of a high pulse width and a low pulse width of a first clock signal, the plurality of delay amounts include a first delay amount corresponding to a first step size and a second delay amount corresponding to a second step size larger than the first step size, the detection information representing relationships in size between each of the plurality of delay amounts and the at least one of the high pulse width and the low pulse width of the first clock signal, wherein the pulse width detection circuit is further configured to compare each of the plurality of delay amounts with the at least one of the high pulse width and the low pulse width to provide the detection information;
a delay line; and
a delay line control circuit coupled to the pulse width detection circuit and the delay line, the delay line control circuit configured to change a delay amount of the delay line by a step size determined responsive, at least in part, to the detection information, the delay line control circuit further configured to change the delay amount of the delay line by the second step size when the at least one of the high pulse width and the low pulse width is larger than each of the first delay amount and the second delay amount.

2. The apparatus of claim 1, wherein the plurality of delay amounts include a first delay amount corresponding to a first step size and a second delay amount corresponding to a second step size larger than the first step size, and
wherein the delay line control circuit is configured to change the delay amount of the delay line by the first step size without changing by the second step size when the at least one of the high pulse width and the low pulse width is larger than the first delay amount and less than the second delay amount.

3. The apparatus of claim 1, wherein the delay line is configured to output a second clock signal.

4. The apparatus of claim 3, further comprising:
a replica circuit configured to receive the second clock signal and output a third clock signal; and
a phase detector configured to compare phases of the first and third clock signals and output a control signal as a result of the comparison,
wherein the delay line control circuit is configured to change the delay amount of the delay line responsive, at least in part, to the control signal.

5. An apparatus comprising:
a pulse width detection circuit configured to provide detection information responsive to a plurality of delay amounts being different from one another and at least one of a high pulse width and a low pulse width of a first clock signal, the detection information representing relationships in size between each of the plurality of delay amounts and the at least one of the high pulse width and the low pulse width of the first clock signal;
a delay line; and
a delay line control circuit coupled to the pulse width detection circuit and the delay line, the delay line control circuit configured to change a delay amount of the delay line by a step size determined responsive, at least in part, to the detection information,
wherein the pulse width detection circuit includes a first variable delay circuit configured to selectively have one of the plurality of delay amounts responsive to a plurality of selector signals.

6. The apparatus of claim 5, wherein the first variable delay circuit is configured to represent respective ones of the relationships between one of the high pulse width and the low pulse width of the first clock signal and the plurality of delay amounts.

7. The apparatus of claim 6, wherein the pulse width detection circuit further includes a second variable delay circuit configured to selectively have one of the plurality of delay amounts responsive to the plurality of selector signals and the second variable delay circuit is configured to represent respective ones of the relationships between other ones of the high pulse width and the low pulse width of the first clock signal and the plurality of delay amounts.

8. An apparatus comprising:
a pulse width detection circuit configured to provide detection information responsive to a plurality of delay amounts being different from one another and at least one of a high pulse width and a low pulse width of a first clock signal, the detection information representing relationships in size between each of the plurality of delay amounts and the at least one of the high pulse width and the low pulse width of the first clock signal;
a delay line; and
a delay line control circuit coupled to the pulse width detection circuit and the delay line, the delay line control circuit configured to change a delay amount of the delay line by a step size determined responsive, at least in part, to the detection information,
wherein the pulse width detection circuit includes a first fixed delay circuit and a second fixed delay circuit each configured to have a first delay amount of the plurality of delay amounts.

9. The apparatus of claim 8, wherein the first fixed delay circuit is configured to represent one of the relationships between one of the high pulse width and the low pulse width of the first clock signal and the first delay amount, the second fixed delay circuit is configured to represent another of the relationships between other ones of the high pulse width and the low pulse width of the first clock signal and the first delay amount.

10. An apparatus comprising:
a delay line configured to delay a first clock signal;
a delay line control circuit configured to adjust a delay amount of the delay line by cyclically updating a plurality of counter bits, the plurality of counter bits including a first counter bit which changes the delay amount by a first step size when a value of the first counter bit is changed and a second counter bit which changes the delay amount by a second step size larger than the first step size when a value of the second counter bit is changed; and
a pulse width detection circuit configured to compare at least one of a first delay amount corresponding to the first step size with at least one of high and low pulse widths of the clock signal and a second delay amount corresponding to the second step size with the at least one of high and low pulse widths of the clock signal,
wherein the delay line control circuit is further configured to update the first counter bit to adjust the delay amount of the delay line when the at least one of the high and low pulse widths of the clock signal is less than the second delay amount and larger than the first delay amount.

11. The apparatus of claim 10, wherein the plurality of counter bits further includes a third counter bit which changes the delay amount by a third step size larger than the second step size when a value of the third counter bit is changed,
wherein the pulse width detection circuit is further configured to compare a third delay amount corresponding to the third step size with the at least one of high and low pulse widths of the clock signal, and
wherein the delay line control circuit is further configured to update the second counter bit to adjust the delay amount of the delay line when the at least one of high and low pulse widths of the clock signal is less than the third delay amount and larger than the second delay amount.

12. The apparatus of claim 10, wherein the pulse width detection circuit includes a first delay circuit configured to compare the first delay amount with the high pulse width of the clock signal and a second delay circuit configured to compare the first delay amount with the low pulse width of the clock signal.

13. The apparatus of claim 12, wherein the pulse width detection circuit further includes a third delay circuit configured to compare the second delay amount with the high pulse width of the clock signal and a fourth delay circuit configured to compare the second delay amount with the low pulse width of the clock signal.

14. The apparatus of claim 13, wherein each of the first, second, third and fourth delay circuits is a fixed delay amount.

15. The apparatus of claim 12, wherein the first delay circuit is further configured to have a variable delay amount, to selectively have the second delay amount and to compare the second delay amount with the high pulse width of the clock signal, and
wherein the second delay circuit is further configured to have a variable delay amount, to selectively have the second delay amount, and to compare the second delay amount with the low pulse width of the clock signal.

16. The apparatus of claim 10, wherein the delay line is configured to output a second clock signal.

17. The apparatus of claim 16, further comprising:
a replica circuit configured to receive the second clock signal and output a third clock signal; and
a phase detector configured to compare phases of the first and third clock signals and output a control signal as a result of the comparison,
wherein the delay line control circuit is configured to change the delay amount of the delay line responsive, at least in part, to the control signal.

\* \* \* \* \*